US010892226B2

(12) United States Patent
Jung

(10) Patent No.: US 10,892,226 B2
(45) Date of Patent: Jan. 12, 2021

(54) POWER SEMICONDUCTOR MODULE

(71) Applicant: LSIS CO., LTD., Anyang-si (KR)

(72) Inventor: Teagsun Jung, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 37 days.

(21) Appl. No.: 16/277,453

(22) Filed: Feb. 15, 2019

(65) Prior Publication Data

US 2019/0267326 A1     Aug. 29, 2019

(30) Foreign Application Priority Data

Feb. 23, 2018   (KR) .................. 10-2018-0021964

(51) Int. Cl.
*H01L 23/538* (2006.01)
*H01L 23/373* (2006.01)
(Continued)

(52) U.S. Cl.
CPC .......... *H01L 23/5386* (2013.01); *H01L 23/36* (2013.01); *H01L 23/373* (2013.01); *H01L 23/5385* (2013.01); *H01L 23/5389* (2013.01); *H01L 25/071* (2013.01); *H01L 25/072* (2013.01); *H01L 25/117* (2013.01); *H01L 25/162* (2013.01); *H01L 25/165* (2013.01); *H01L 25/18* (2013.01); *H01L 23/473* (2013.01);
(Continued)

(58) Field of Classification Search
CPC ......... H01L 28/60; H01L 28/65; H01L 28/75; H01L 25/071; H01L 25/072; H01L 25/117; H01L 25/162; H01L 25/165; H01L 25/18; H01L 23/36; H01L 23/37; H01L 23/373; H01L 23/47; H01L 23/473; H01L 23/53; H01L 23/538; H01L 23/5385; H01L 23/5386; H01L 23/5389
USPC ....................................................... 257/691
See application file for complete search history.

(56) References Cited

U.S. PATENT DOCUMENTS

2009/0257212 A1   10/2009   Takano et al.
2010/0302737 A1   12/2010   Yankoski et al.
(Continued)

FOREIGN PATENT DOCUMENTS

| KR | 20110129890 A | 12/2011 |
| KR | 101674466 B1 | 11/2016 |
| WO | 2017221730 A1 | 12/2017 |

OTHER PUBLICATIONS

European Search Report for related European Application No. 19158143.8; action dated May 9, 2019; (7 pages).
(Continued)

*Primary Examiner* — Monica D Harrison
(74) *Attorney, Agent, or Firm* — K&L Gates LLP

(57) ABSTRACT

A power semiconductor module may include a first plate, a second plate configured to include first and second device receiving portions thereinside, and coupled to one side of the first plate, first and second power semiconductor devices arranged in the first and second device receiving portions, first and second input bus bars coupled to an outside of the second plate, a third plate configured to include third and fourth device receiving portions thereinside, and coupled to the other side of the first plate, third and fourth power semiconductor devices arranged in the third and fourth device receiving portions, and third and fourth input bus bars coupled to an outside of the third plate.

20 Claims, 4 Drawing Sheets

(51) Int. Cl.
  *H01L 25/07* (2006.01)
  *H01L 25/16* (2006.01)
  *H01L 25/11* (2006.01)
  *H01L 25/18* (2006.01)
  *H01L 23/36* (2006.01)
  *H01L 23/473* (2006.01)

(52) U.S. Cl.
  CPC ................ *H01L 2225/1064* (2013.01); *H01L 2225/1094* (2013.01)

(56) References Cited

U.S. PATENT DOCUMENTS

| | | |
|---|---|---|
| 2011/0057713 A1 | 3/2011 | Kawanami et al. |
| 2016/0057881 A1* | 2/2016 | Tada .................... H05K 7/1432 361/728 |

OTHER PUBLICATIONS

Korean Office Action for related Korean Application No. 10-2018-0021964; action dated Feb. 23, 2018; (5 pages).

* cited by examiner

[Fig. 1]
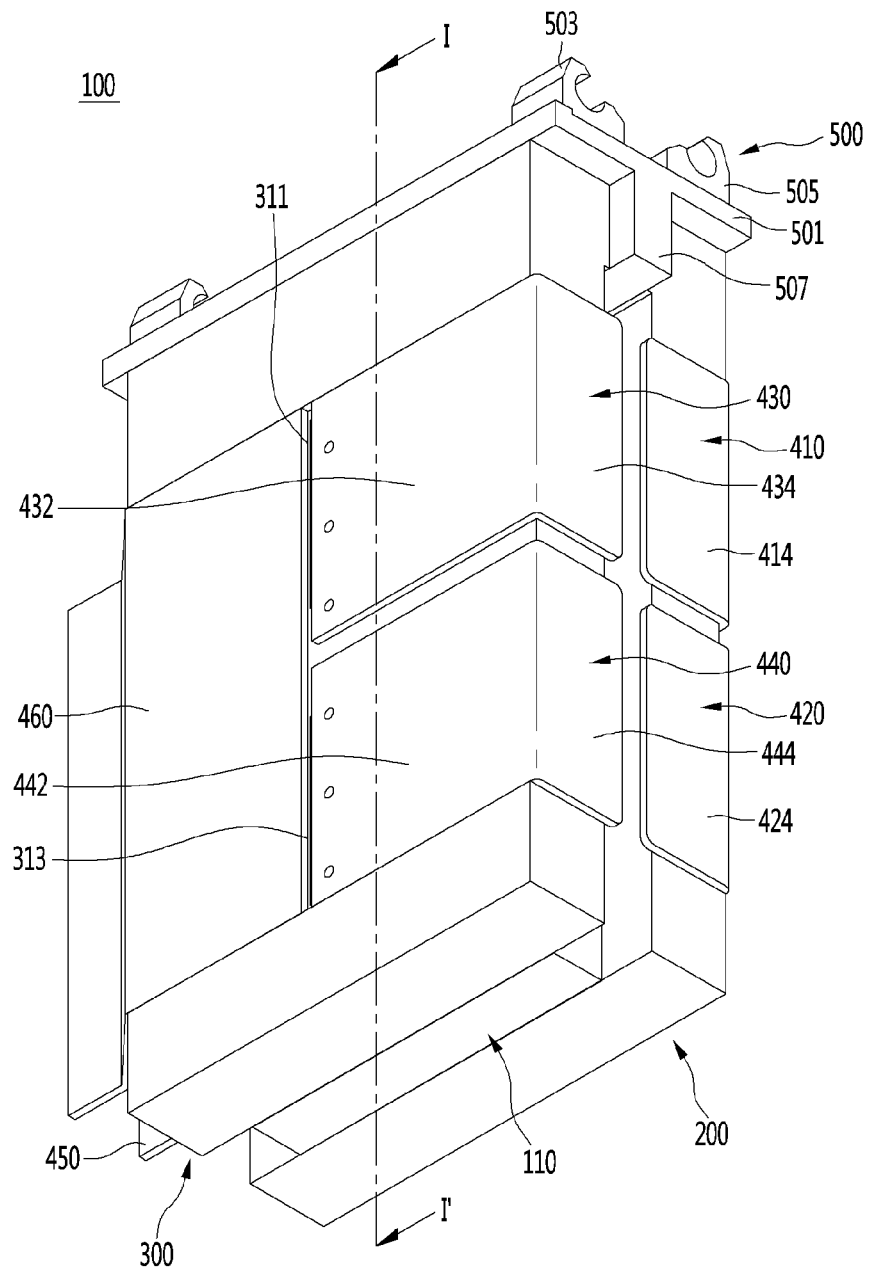

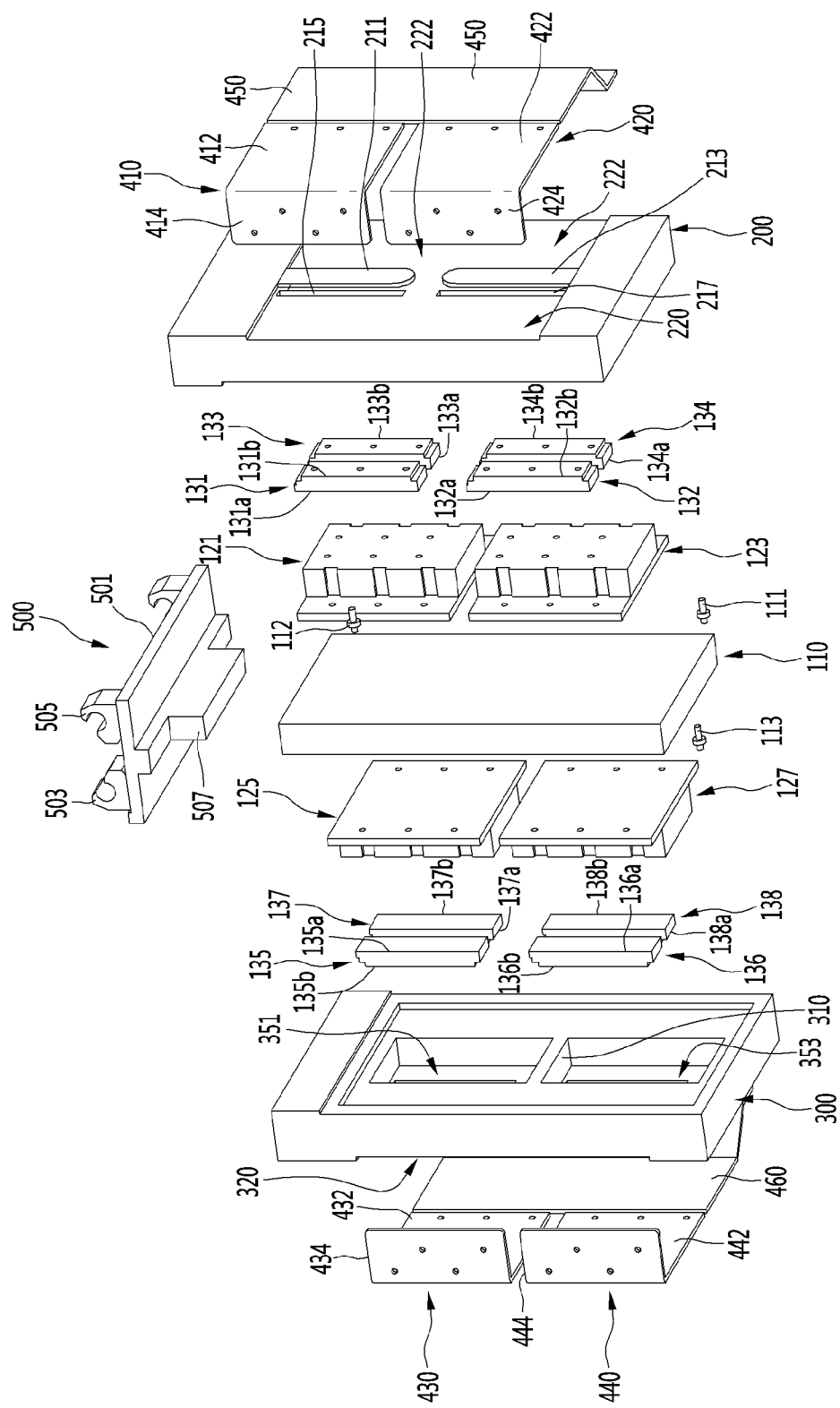
[Fig. 2]

[Fig. 3]
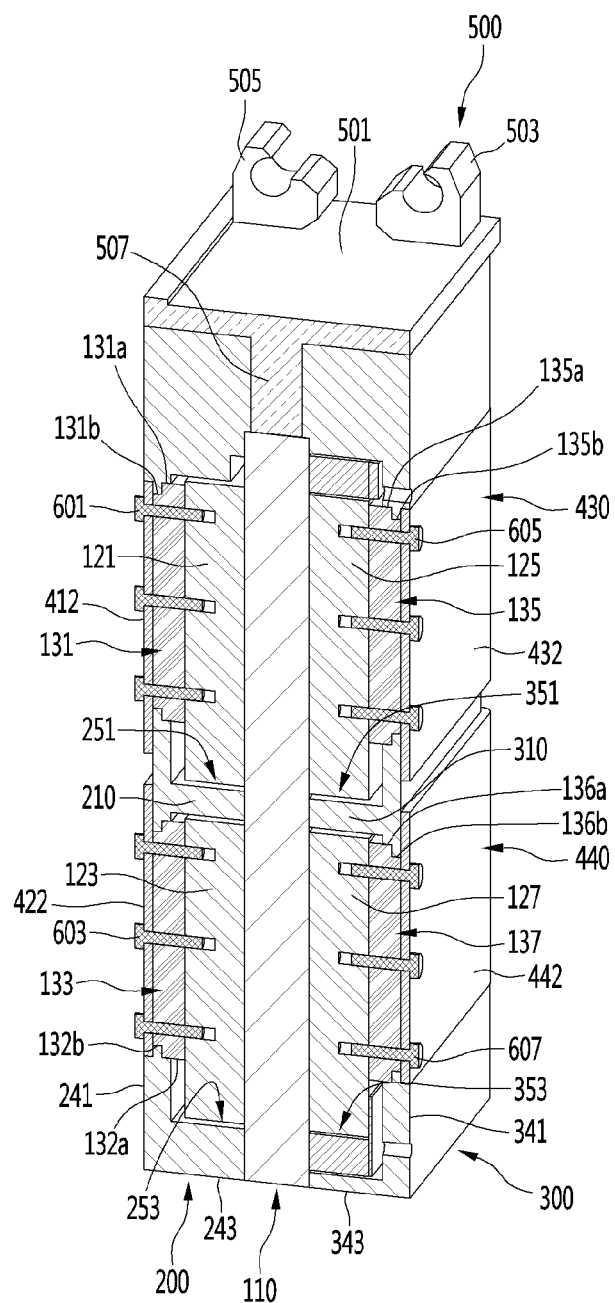

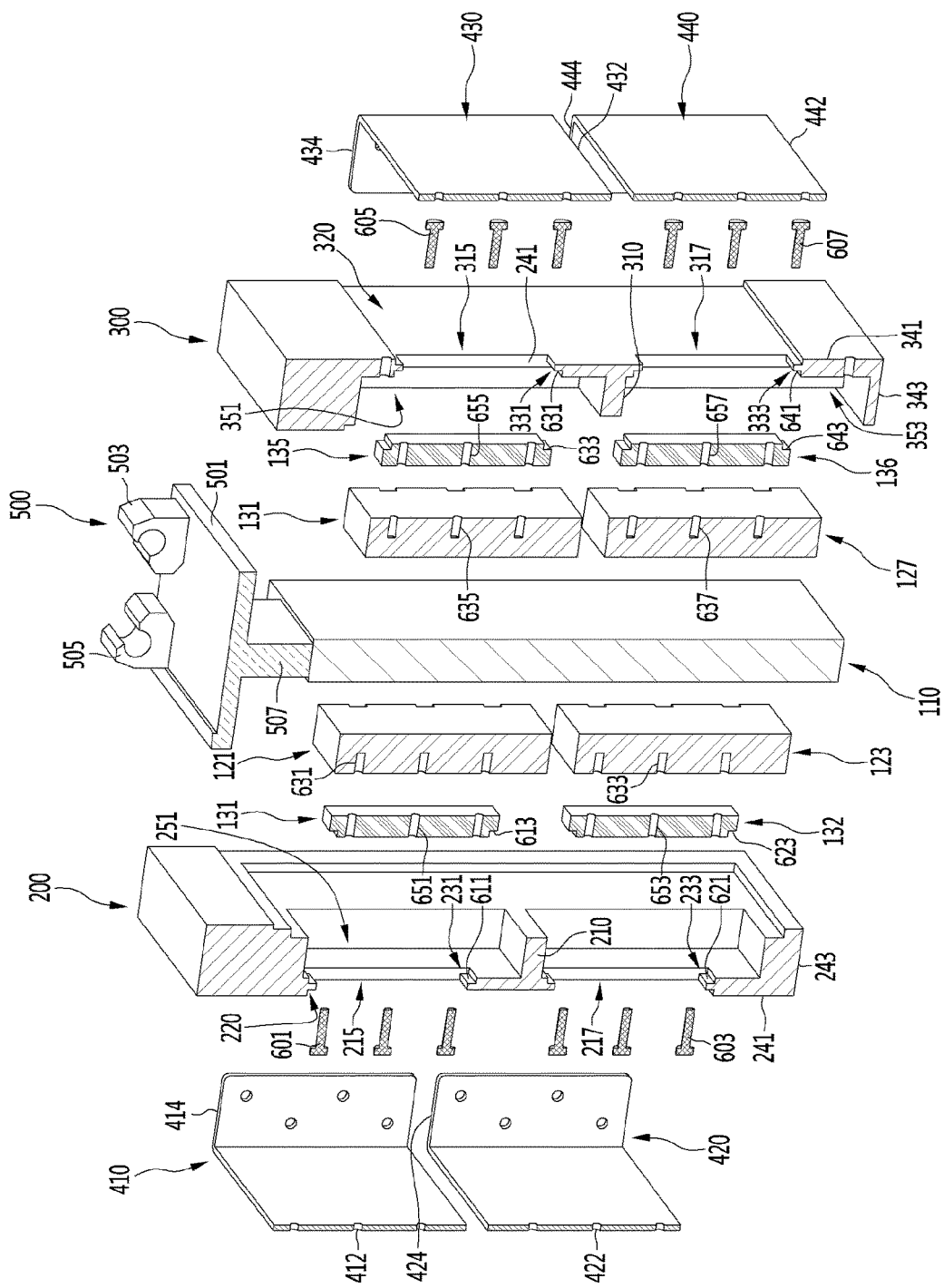
[Fig. 4]

POWER SEMICONDUCTOR MODULE

CROSS-REFERENCE TO RELATED APPLICATIONS

Pursuant to 35 U.S.C. § 119(a), this application claims the benefit of earlier filing date and right of priority to Korean Application No. 10-2018-0021964, filed on Feb. 23, 2018, which is herein expressly incorporated by reference in its entirety.

BACKGROUND OF THE INVENTION

1. Field of the Invention

An embodiment relates to a power semiconductor module.

2. Description of the Conventional Art

In the field of energy distribution, for example, in the field of High Voltage Direct Current (HVDC) or Flexible AC Transmission System (FACTS), it is common to convert high AC voltage to DC voltage and vice versa. For this purpose, a plurality of power semiconductor modules are usually connected in series.

Power semiconductor modules are provided with power semiconductor devices. High voltage is applied to power semiconductor modules connected in series as described above, and when an error occurs in the control of the high voltage, a power semiconductor device provided in a power semiconductor module explodes. Accordingly, there is a problem that another power semiconductor module is damaged due to the explosion of a power semiconductor device of the relevant power semiconductor module.

SUMMARY OF THE INVENTION

An object of the embodiment is to solve the above-described and other problems.

Another object of the embodiment is to provide a power semiconductor module that simplifies the structure.

Still another object of the embodiment is to provide a power semiconductor module that significantly enhances explosion-proof performance in order to prevent damage to other power semiconductor modules in the vicinity.

Yet still another object of the embodiment is to provide a power semiconductor module with a reduced thickness.

Still yet another object of the embodiment is to provide a power semiconductor module with enhanced fastening properties of a bus bar.

In order to achieve the above or other objects, according to an aspect of the embodiment, a power semiconductor module may include a first plate; a second plate configured to include first and second device receiving portions thereinside, and coupled to one side of the first plate; first and second power semiconductor devices arranged in the first and second device receiving portions; first and second input bus bars coupled to an outside of the second plate; a third plate configured to include third and fourth device receiving portions thereinside, and coupled to the other side of the first plate; third and fourth power semiconductor devices arranged in the third and fourth device receiving portions; and third and fourth input bus bars coupled to an outside of the third plate.

The effect of the power semiconductor module according to the embodiment will be described as follows.

According to at least one of embodiments, first through fourth device receiving portions accommodating first through fourth power semiconductor devices may be formed on each inner surface of second and third plates disposed on both sides of a first plate, and first through fourth input bus bars and first and second output bus bars may be connected to the first through fourth power semiconductor devices through second and third plates, thereby having an advantage of simplifying structure as much as possible.

According to at least one of embodiments, first through fourth power semiconductor devices may be arranged in each of first through fourth device receiving portions formed on each inner surface of second and third plates disposed on both sides of a first plate, thereby having an advantage capable of not affecting other power semiconductor device modules in the vicinity even when one of the first through fourth power semiconductor devices explodes.

According to at least one of embodiments, a bus bar receiving portion may be formed on an outer surface of each of second and third plates, and first through fourth input bus bars and first and second output bus bars may be accommodated in the bus bar receiving portion, thereby having an advantage capable of reducing thickness.

According to at least one of embodiments, first through eighth connecting electrodes capable of being brought into surface contact with each of first through fourth input bus bars, first and second output bus bars and first through fourth power semiconductors, respectively, may be arranged, thereby having an advantage capable of minimizing contact resistance to reduce power loss.

According to at least one of embodiments, each of first through fourth input bus bars and first and second output bus bars may be fastened to first through fourth power semiconductor devices through second and third plates and first through eighth connecting electrodes using screws, thereby enhancing fastening properties and simplifying fastening structure.

Further scope of applicability of the embodiment will become apparent from the detailed description given hereinafter. However, it should be understood that the detailed description and specific examples such as preferred embodiments are given by way of illustration only, since various changes and modifications within the spirit and scope of the embodiment will become apparent to those skilled in the art from this detailed description.

BRIEF DESCRIPTION OF THE DRAWING

The embodiments will be described in detail with reference to the following drawings in which like reference numerals refer to like elements wherein:

FIG. 1 is a perspective view illustrating a power semiconductor module according to an embodiment;

FIG. 2 is an exploded perspective view illustrating a power semiconductor module according to an embodiment;

FIG. 3 is a cross-sectional view taken along line I-I' in FIG. 1; and

FIG. 4 is an exploded cross-sectional view taken along line I-I' in FIG. 1.

DETAILED DESCRIPTION OF THE PREFERRED EMBODIMENT

Hereinafter, embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present invention. Also, it should be understood that the accompanying drawings are merely illustrated to easily explain an embodiment disclosed herein, and therefore, they should not be construed to limit the technological concept disclosed herein by the accompanying drawings, and the concept of the present disclosure should be construed as being extended to all modifications, equivalents, and substitutes included in the concept and technological scope of the invention.

A power semiconductor module according to an embodiment may be used as a switching device. For instance, the power semiconductor module according to an embodiment may be used as a switching device included in a converter. The converter may be employed in various technical fields, and may be employed in power compensation devices such as STATCOM (STATic synchronous COMpensator).

FIG. 1 is a perspective view illustrating a power semiconductor module according to an embodiment, and FIG. 2 is an exploded perspective view illustrating a power semiconductor module according to an embodiment. FIG. 3 is a cross-sectional view taken along line I-I' in FIG. 1, and FIG. 4 is an exploded cross-sectional view taken along line I-I' in FIG. 1.

Referring to FIGS. 1 through 4, a power semiconductor module 100 according to an embodiment may include a plurality of plates 110, 200, 300 and a plurality of power semiconductor devices 121, 123, 125, 127. The power semiconductor module 100 according to the embodiment may further include a plurality of input bus bars 410 through 440 and first and second output bus bars 450, 460. The power semiconductor module 100 according to the embodiment may further include a sliding guide portion 500.

The sliding guide portion 500 may be a member for easily moving the power semiconductor module 100 according to the embodiment. The sliding guide portion 500 may include a support portion 501, first and second rail receiving portions 503, 505, and an extension portion 507. The extension portion 507 may extend vertically from a first surface of the support portion 501. The first and second rail receiving portions 503, 505 may be disposed on a second side of the support portion 501. The first and second rail receiving portions 503, 505 may be coupled to first and second sliding rails. An oil-free bearing is provided on an inside of the first and second rail receiving portions 503, 505 to enable sliding movement along the first and second sliding rails. A second surface may be a surface opposite to the first surface. The extension portion 507 may be disposed, for instance, between a second plate 200 and a third plate 300. The support portion 501 and/or the extension portion 507 may be fastened to the second plate 200 and the third plate 300.

According to an embodiment, the heavy-weight power semiconductor module 100 may be easily moved to a desired position by the sliding guide portion 500.

For instance, the plate may include a first plate 110, a second plate 200, and a third plate 300. For instance, a power semiconductor device may include a first power semiconductor device 121, a second power semiconductor device 123, a third power semiconductor device 125, and a fourth power semiconductor device 127. For instance, an input bus bar may include a first input bus bar 410, a second input bus bar 420, a third input bus bar 430, and a fourth input bus bar 440. Although not shown, the first input bus bar 410 and the third input bus bar 430 may be connected in common, and the second input bus bar 420 and the fourth input bus bar 440 may be connected in common. For instance, a first input signal (voltage or power) may be commonly applied to the first input bus bar 410 and the third input bus bar 430. For instance, a second input signal (voltage or power) may be commonly applied to the second input bus bar 420 and the fourth input bus bar 440.

The second plate 200 and the third plate 300 may have a shape or structure symmetrical with respect to the first plate 110. The first plate 110 may be formed of a material having excellent heat dissipation performance. Each of the second and third plates 200, 300 may be formed of a material having excellent insulating properties. The first through fourth input bus bars 410 to 440 and the first and second output bus bars 450, 460 may be formed of a material having excellent electrical conductivity.

A plurality of cell spaces for accommodating the first through fourth power semiconductor devices 121, 123, 125, 127 may be formed by the coupling of the first plate 110, the second plate 200 and the third plate 300. The cell space may be a space larger than the volume of the power semiconductor device. For instance, first and second cell spaces may be formed by coupling the first plate 110 and the second plate 200. For instance, third and fourth cell spaces may be formed by coupling the second plate 110 and the third plate 300. The first through fourth cell spaces may be first through fourth device receiving portions 251, 253, 351, 353 which will be described later. For instance, the first and second device receiving portions 251, 253 may be formed on an inner surface (hereinafter, referred to as a first surface) of the second plate 200. For instance, the third and fourth device receiving portions 351, 353 may be formed on an inner surface (hereinafter, referred to as a first surface) of the third plate 300. Here, the first surface of the second plate 200 may be a surface facing the first surface of the first plate 110, and the first surface of the third plate 300 may be a surface facing the second surface of the first plate 110.

The first and second power semiconductor devices 121, 123 may be located in the first and second cell spaces formed by the coupling of the first plate 110 and the second plate 200. The third and fourth power semiconductor devices 125, 127 may be located in the third and fourth cell spaces formed by the coupling of the first plate 110 and the third plate 300.

For instance, first, the first and second power semiconductor devices 121, 123 are fastened onto the first surface of the first plate 110, and then the second plate 200 may be fastened onto the first surface of the first plate 110. The first and second power semiconductor devices 121, 123 may be located in the first and second device receiving portions 251, 253 of the second plate 200. The first and second power semiconductor devices 121, 123 may be covered by the second plate 200. The first plate 110 and the second plate 200 are sealed to shield the first and second device receiving portions 251, 253 from the outside. Accordingly, even when the first or second power semiconductor devices 121, 123 explodes, the influence due to the explosion may not be transmitted to other power semiconductor modules in the vicinity, thereby preventing the damage of the other power semiconductor modules. Similarly, first, the third and fourth power semiconductor devices 125, 127 are fastened onto the second surface of the first plate 110, and then the third plate 300 may be fastened onto the second surface of the first plate 110. The second surface may be a surface opposite to the first surface. The third and fourth power semiconductor devices 125, 127 may be located in the third and fourth device receiving portions 351, 353 of the third plate 300. The third and fourth power semiconductor devices 125, 127 may be covered by the third plate 300. The first plate 110 and the third plate 300 are sealed to shield the third and fourth device receiving portions 351, 353 from the outside. Accordingly, even when the third or fourth power semiconductor devices 125, 127 explodes, the influence due to the explosion may not be transmitted to other power semiconductor modules in the vicinity, thereby preventing the damage of the other power semiconductor modules.

The first through fourth input bus bars 410 to 440 and the first and second output bus bars 450, 460 may be fastened to the second and third plates 200, 300. Specifically, the first through fourth input bus bars 410 to 440 and the first and second output bus bars 450, 460 may be fastened to an outer surface (hereinafter, referred to as a second surface) of the second and third plates 200, 300. The second surface may be a surface opposite to the first surface provided with the first through fourth device receiving portions 251, 253, 351, 353 on the second and third plates 200, 300. For instance, the first and second input bus bars 410, 420 and the first output bus bar 450 may be fastened to the second surface of the second plate 200. The first and second input bus bars 410, 420 and the first output bus bar 450 may be arranged to be spaced apart from each other. For instance, the third and fourth input bus bars 430, 440 and the second output bus bar 460 may be fastened to the second surface of the third plate 300. The first and second input bus bars 430, 440 and the second output bus bar 460 may be arranged to be spaced apart from each other.

For instance, each of the first and second input bus bars 410, 420 and the first output bus bar 450 may be electrically connected to the first and second power semiconductor devices 121 through the second plate 200. Specifically, the first input bus bar 410 may be electrically connected to the first power semiconductor device 121 through a first region of the second plate 200. The second input bus bar 420 may be electrically connected to the second power semiconductor device 123 through a second region of the second plate 200. The first output bus bar 450 may be electrically connected to the first and second power semiconductor devices 121, 123 through third and fourth regions of the second plate 200, respectively. The first output bus bar 450 may be commonly connected to the first and second power semiconductor devices 121, 123. Specifically, the third input bus bar 430 may be electrically connected to the third power semiconductor device 125 through a fifth region of the third plate 300. The fourth input bus bar 440 may be electrically connected to the fourth power semiconductor device 127 through a sixth region of the third plate 300. The second output bus bar 460 may be electrically connected to the third and fourth power semiconductor devices 125, 127 through seventh and eighth regions of the third plate 300, respectively. The second output bus bar 460 may be commonly connected to the third and fourth power semiconductor devices 125, 127.

The first through fourth input bus bars 410 to 440 and the first and second output bus bars 450, 460 may have a plate shape. It is required to minimize an electrical contact resistance between the first through fourth power semiconductor devices 121, 123, 125, 127 and the first through fourth input bus bars 410 to 440 and the first and second output bus bars 450, 460. For this purpose, the first through eighth connecting electrodes 131 to 138 may be provided as media for making surface contact between the first through fourth power semiconductor devices 121, 123, 125, 127 and the first through fourth input bus bars 410 to 440 and the first and second output bus bars 450, 460. Therefore, one surface of each of the first through eighth connecting electrodes 131 to 138 may be brought into surface contact with an outer surface (or upper surface) of each of the first through fourth power semiconductor devices 121, 123, 125, 127, and the other surface of each of the first through eighth connecting electrodes 131 to 138 may be brought into surface contact with an inner surface of each of the first through fourth input bus bars 410 to 440 and the first and second output bus bars 450, 460, thereby minimizing contact resistance to reduce power loss.

Each of the first through eighth connecting electrodes 131 to 138 may have first and second surfaces having a flat surface. The second surface may be a surface opposite to the first surface. For instance, a first surface of each of the first through eighth connecting electrodes 131 to 138 may be a surface facing an upper surface of the first through fourth power semiconductor devices 121, 123, 125, 127. For instance, a second surface of each of the first through eighth connecting electrodes 131 to 138 may be a surface facing an inner surface of each of the first through fourth input bus bars 410 to 440 and the first and second output bus bars 450, 460.

For instance, a first surface of the first connecting electrode 131 may be brought into surface contact with a first region of an upper surface of the first power semiconductor device 121, and a second surface of the first connecting electrode 131 may be brought into surface contact with an inner surface of the first input bus bar 410. For instance, a first surface of the second connecting electrode 132 may be brought into surface contact with a first region of an upper surface of the second power semiconductor device 123, and a second surface of the second connecting electrode 132 may be brought into surface contact with an inner surface of the second input bus bar 420.

For instance, a first surface of the third connecting electrode 133 may be brought into surface contact with a second region of an upper surface of the first power semiconductor device 121, and a second surface of the third connecting electrode 133 may be brought into surface contact with a first region of an inner surface of the first output bus bar 450. For instance, a first surface of the fourth connecting electrode 134 may be brought into surface contact with a second region of an upper surface of the second power semiconductor device 123, and a second surface of the fourth connecting electrode 134 may be brought into surface contact with a second region of an inner surface of the first output bus bar 450.

For instance, a first surface of the fifth connecting electrode 135 may be brought into surface contact with a first region of an upper surface of the third power semiconductor device 125, and a second surface of the fifth connecting electrode 135 may be brought into surface contact with an inner surface of the third input bus bar 430. For instance, a first surface of the sixth connecting electrode 136 may be brought into surface contact with a first region of an upper surface of the fourth power semiconductor device 127, and a second surface of the sixth connecting electrode 136 may be brought into surface contact with an inner surface of the fourth input bus bar 440.

For instance, a first surface of the seventh connecting electrode 137 may be brought into surface contact with a second region of an upper surface of the third power semiconductor device 125, and a second surface of the seventh connecting electrode 137 may be brought into surface contact with a first region of an inner surface of the second output bus bar 460. For instance, a first surface of the eighth connecting electrode 138 may be brought into surface contact with a second region of an upper surface of the fourth power semiconductor device 127, and a second surface of the eighth connecting electrode 138 may be brought into surface contact with a second region of an inner surface of the second output bus bar 460.

In the power semiconductor module 100 according to the embodiment, when components arranged on a first surface of the first plate 110 with respect to the first plate 110 and components arranged on a second surface of the first plate 110 have the same function, structure and shape, they have symmetrical structures. For instance, the first and second power semiconductor devices, the first through fourth connecting electrodes 131 to 134, the second plate 200, the first and second input bus bars 410, 420 and the first output bus bar 450 may be arranged on a first surface of the first plate 110. For instance, the third and fourth power semiconductor devices 125, 127, the fifth through eighth connecting electrodes 135 to 138, the third plate 300, the third and fourth input bus bars 430, 440 and the second output bus bar 460 may be arranged on a second surface of the first plate 110. The third and fourth power semiconductor devices 125, 127 may be symmetrical to the first and second power semiconductor devices 121, 123 with respect to the first plate 110. The fifth through eighth connecting electrodes 135 to 138 may be symmetrical to the first through fourth connecting electrodes 131 to 134 with respect to the first plate 110. The third and fourth input bus bars 430, 440 may be symmetrical to the first and second input bus bars 410, 420 with respect to the first plate 110. The second output bus bar 460 may be symmetrical to the first output bus bar 450 with respect to the first plate 110.

Hereinafter, each of the components included in the power semiconductor module 100 according to the embodiment will be described in detail.

First Plate 110

The power semiconductor module 100 according to the embodiment may provide the first plate 110.

The first plate 110 may be made of stainless steel having excellent heat dissipation performance, but other materials may also be used. The first plate 110 may be formed of a cooling plate. The cooling plate may be provided with a passage capable of allowing coolant or cooling water to flow. The passage may be disposed in a zigzag shape, for instance, in the entire area of the first plate 110, but the present disclosure is not limited thereto.

For instance, PCW (process cooling water) may be used for the cooling water, but the present disclosure is not limited thereto.

The term "refrigerant" refers to all substances causing a cooling effect in a broad sense, and mainly refers to working fluid that evaporates in the low temperature section (evaporator) to absorb heat from the surroundings and release heat from the high temperature section (condenser) while circulating in the cycle such as a refrigeration device, a heat pump, an air conditioner, a small temperature difference thermal energy utilization system, and the like. For example, in the embodiment, for the refrigerant, ammonia, freon (chloro-fluoro-carbon (CIFC)), hydro-chloro-fluoro-carbon (HCFC), hydro-fluoro-carbon, hydro-fluoro-olefin (HFO), methyl chloride or the like may be employed, and liquid helium, liquid hydrogen or the like may be used to lower the temperature to an ultra-low temperature.

The first plate 110 may easily discharge heat generated from the first through fourth power semiconductor devices 121, 123, 125, 127 to the outside through heat exchange by refrigerant or cooling water flowing in the passage.

The first and second surfaces of the first plate 110 may have a flat surface. Each of the first and second surfaces of the first plate 110 may have a plurality of threaded grooves (not shown) that can be fastened to screws. The second surface may be a surface opposite to the first surface. The first plate 110 may have a rectangular shape, but the present disclosure is not limited thereto. The first through fourth power semiconductor devices 121, 123, 125, 127 may be fastened to grooves formed on the first and second surfaces of the first plate 110 using screws.

Second and Third Plates 200, 300

The power semiconductor module 100 according to the embodiment may provide the second plate 200.

For instance, the second plate 200 may be disposed on the first surface of the first plate 110. The second plate 200 may be made of a resin material having excellent insulating properties. For instance, the second plate 200 may include epoxy resin, but the present disclosure is not limited thereto. The second plate 200 may have a plurality of threaded holes (not shown). The second plate 200 may be fastened to the first surface of the first plate 110 using a plurality of screws.

For instance, the second plate 200 may include a body 241, a sidewall 243, and a partition wall 210. The body 241, the sidewall 243, and the partition wall 210 may be integrally formed.

The body 241 may have a rectangular shape. The sidewall 243 may be formed to extend vertically from an edge region of the body 241. The sidewall 243 may be formed along a circumference of the body 241. The partition wall 210 may be formed to extend vertically from the central region of the body 241. The partition wall 210 may be formed in an elongated manner along one direction from the center of the body 241.

At least one or more regions of the second plate 200, for instance, a bottom surface of the sidewall 243 and bottom surface of the partition wall 210 of the second plate 200 may be in contact with the first surface of the first plate 110.

The second plate 200 may include first and second device receiving portions 251, 253. Each of the first and second device receiving portions 251, 253 may be formed by the body 241, the sidewall 243, and the partition wall 210. In other words, the first device receiving portion 251 may be formed by one side region of the body 241, the partition wall 210 and the sidewall 243, and the second device receiving portion may be formed by the other side region of the body 241, the partition wall 210, and sidewall 243.

A first power semiconductor and first and third connecting electrodes 131, 133 may be accommodated in the first device receiving portion 251. The first device receiving portion 251 may cover the first power semiconductor and the first and third connecting electrodes 131, 133. For instance, the first power semiconductor device 121 is fastened onto a first region of the first surface of the first plate 110, and the first and third connecting electrodes 131, 133 may be disposed on the first power semiconductor device 121. The second plate 200 may fastened onto the first surface of the first plate 110 to cover the first power semiconductor device 121 and the first and third connecting electrodes 131, 133 by the first device receiving portion 251 of the second plate 200. For instance, the first connecting electrode 131 may be connected to the input electrode pad of the first power semiconductor device 121, and the third connecting electrode 133 may be connected to the output electrode pad of the first power semiconductor device 121. For instance, the first power semiconductor and the first and third connecting electrodes 131, 133 may be surrounded by the first device receiving portion 251 of the first plate 110 and the second plate 200. Accordingly, the first power semiconductor and the first and third connecting electrodes 131, 133 may be protected by the first device receiving portion 251 of the first plate 110 and the second plate 200. Accordingly, the first power semiconductor device 121 may be protected by the first device receiving portion 251 of the first plate 110 and the second plate 200. Furthermore, even when the first power semiconductor device 121 is exploded by the first device receiving portion 251 of the first plate 110 and the second plate 200, other power semiconductor modules adjacent to the exploded power semiconductor device 100 may not be damaged.

A second power semiconductor and second and fourth connecting electrodes 132, 134 may be accommodated in the second device receiving portion 253. The second device receiving portion 253 may cover the second power semiconductor and the second and fourth connecting electrodes 132, 134. For instance, the second power semiconductor device 123 is fastened onto a second region of the first surface of the first plate 110, and the second and fourth connecting electrodes 132, 134 may be disposed on the second power semiconductor device 123. The second plate 200 may fastened onto the first surface of the first plate 110 to cover the second power semiconductor device 123 and the second and fourth connecting electrodes 132, 134 by the second device receiving portion 253 of the second plate 200. For instance, the second connecting electrode 132 may be connected to the input electrode pad of the second power semiconductor device 123, and the fourth connecting electrode 134 may be connected to the output electrode pad of the second power semiconductor device 123. For instance, the second power semiconductor and the second and fourth connecting electrodes 132, 134 may be surrounded by the second device receiving portion 253 of the first plate 110 and the second plate 200. Accordingly, the second power semiconductor and the second and fourth connecting electrodes 132, 134 may be protected by the second device receiving portion 253 of the first plate 110 and the second plate 200. Accordingly, the second power semiconductor device 123 may be protected by the second device receiving portion 253 of the first plate 110 and the second plate 200. Furthermore, even when the second power semiconductor device 123 is exploded by the second device receiving portion 253 of the first plate 110 and the second plate 200, other power semiconductor modules adjacent to the exploded power semiconductor device 100 may not be damaged.

The second plate 200 may include first and second electrode receiving portions 231, 233 for accommodating the first and second connecting electrodes 131, 132, respectively. Although not shown, the second plate 200 may include third and fourth electrode receiving portions for accommodating the third and fourth connecting electrodes 133, 134, respectively. The second plate 200 may include first and second openings 215, 217. Although not shown, the second plate 200 may include third and fourth openings.

The first electrode receiving portion 231 and the third electrode receiving portion may be connected to the first device receiving portion 251. The second electrode receiving portion 233 and the fourth electrode receiving portion may be connected to the second device receiving portion 253. In addition, the first opening 215 and the third opening may be connected to the first electrode receiving portion 231 and the third electrode receiving portion, respectively. The second opening 217 and the fourth opening may be connected to the second electrode receiving portion 233 and the fourth electrode receiving portion, respectively.

The first through fourth electrode receiving portions may be formed on an inner surface of the body 241 of the second plate 200. As described above, the first and second device receiving portions 251, 253 may be formed by the body 241, the sidewall 243, and the partition wall 210 of the second plate 200. A size of each of the first through fourth electrode receiving portions may be smaller than that of each of the first and second device receiving portions 251, 253. A size of each of the first through fourth electrode receiving portions may be equal to that of each of the first through fourth connecting electrodes 131 to 134. The first through fourth openings 215, 217 may be holes passing through the body 241 of the second plate 200.

A size of each of the first through fourth openings 215, 217 may be smaller than that of each of the first through fourth electrode receiving portions. Accordingly, a first engaging portion 611 may be formed on the first electrode receiving portion 231 meeting the first opening 215, and an second engaging portion 621 may be formed on the second electrode receiving portion 233 meeting the second opening 217. Although not shown, a third engaging portion may be formed on the third electrode receiving portion meeting the third opening, and a fourth engaging portion may be formed on the fourth electrode receiving portion meeting the fourth opening. The first connecting electrode 131 is formed with a first engaging protrusion 613 corresponding to the first engaging portion 611, and the second connecting electrode 132 is formed with a second engaging portion 621 corresponding to the second engaging portion 621. Although not shown, the third connecting electrode 133 is formed with a third engaging protrusion corresponding to a third engaging protrusion, and the fourth connecting electrode 134 is formed with a fourth engaging protrusion corresponding to a fourth engaging portion.

Therefore, when the first through fourth connecting electrodes 131 to 134 are provided to the first through fourth electrode receiving portions and the first through fourth openings 215, 217, the first engaging protrusion 613 of the first connecting electrode 131 may be fixed by the first engaging portion 611, and the second engaging protrusion 623 of the second connecting electrode 132 may be fixed by the second engaging portion 621. Furthermore, the third engaging protrusion of the third connecting electrode 133 may be fixed by the third engaging portion and the fourth engaging protrusion of the fourth connecting electrode 134 may be fixed by the fourth engaging portion.

Specifically, part of each of the first through fourth connecting electrodes 131 to 134 may be accommodated in the first through fourth electrode receiving portions, and the other part of each of the first through fourth connecting electrodes 131 to 134 may be inserted into the first through fourth openings 215, 217. Specifically, a body electrode 131a of the first connecting electrode 131 is accommodated in the first electrode receiving portion 231, and a protruding electrode 131b extended from the body electrode 131a is inserted into the first opening 215. Specifically, a body electrode 132a of the second connecting electrode 132 is accommodated in the second electrode receiving portion 233, and a protruding electrode 132b extended from the body electrode 132a is inserted into the second opening 217. Specifically, a body electrode 133a of the third connecting electrode 133 is accommodated in the third electrode receiving portion 233, and a protruding electrode 133b extended from the body electrode 133a is inserted into the third opening 217. Specifically, a body electrode 134a of the fourth connecting electrode 134 is accommodated in the third electrode receiving portion, and a protruding electrode 134b extended from the body electrode 134a is inserted into the third opening.

A size of each of the body electrodes 131a to 134a of each of the first through fourth connecting electrodes 131 to 134 may be the same as that of each of the first through fourth electrode receiving portions. A size of each of the protruding electrodes 131b to 134b of the first through fourth connecting electrodes 131 to 134 may be the same as that of each of the first through fourth openings 215, 217. A size of the protruding electrodes 131b to 134b may be smaller than that of the body electrodes 131a to 134a.

A size of each of the first and second device receiving portions 251, 253 may be equal to or larger than that of the first and second power semiconductor devices 121, 123. A depth of each of the first and second device receiving portions 251, 253 may be equal to or larger than that of the first and second power semiconductor devices 121, 123.

The second plate 200 may include first and second protruding portions 211, 213. Furthermore, the second plate 200 may include first and second bus bar receiving portions 220, 222.

The first protruding portion 211 may be formed in a first region of the second surface of the second plate 200, and the second protruding portion 213 may be formed in a second region of the second surface of the second plate 200. The first region and the second region may be spaced apart. The first protruding portion 211 and the second protruding portion 213 may be formed in an elongated manner along one direction. The first and second protruding portions 211, 213 may be formed to protrude vertically from the second surface of the second plate 200. The first protruding portion 211 and the second protruding portions 213 may be disposed in the center region of the second surface of the second plate 200. The first and second protrusions 211, 213 may be formed integrally with the second plate 200, but the present disclosure is not limited thereto.

The first bus bar receiving portion 220 and the second bus bar receiving portion 222 may be disposed with respect to the first and second protruding portions 211, 213. The first and second bus bar receiving portions 220, 222 may be grooves recessed inward from the second surface of the second plate 110. The first and second input bus bars 410, 420 may be accommodated in the first bus bar receiving portion 220, and the first output bus bar 450 may be accommodated in the second bus bar receiving portion 222. Specifically, the first input bus bar 410 may be disposed on one side with respect to the first protruding portion 211, and the second input bus bar 420 may be disposed on one side with respect to the second protruding portion 213. The first and second input bus bars 420 may be disposed on the same side. The first output bus bar 450 may be disposed on the other side with respect to the first and second protruding portions 211, 213.

An upper surface of each of the first and second protrusions 211, 213 may be located on the same plane as the second surface of the second plate.

A thickness of each of the first and second input bus bars 410, 420 and the first output bus bar 450 may be the same as a depth of the first and second bus bar receiving portions 220, 222. Accordingly, when each of the first and second input bus bars 410, 420 and the first output bus bar 450 is accommodated in the first and second bus bar accommodating portions 220, 222, an outer surface of each of the first and second input bus bars 410, 420 and the first output bus bar 450 and a second surface of the second plate 200 are located on the same flat surface, and thus an overall thickness of the power semiconductor module 100 according to an embodiment may be reduced. In addition, the first and second input bus bars 410, 420 and the first output bus bar 450 are fixed by the first and second bus bar receiving portions 220, 222, and thus the fixability of the bus bars 410, 420 and the first output bus bar 450 may be improved. On the other hand, each of the first and second input bus bars 410, 420 and the first output bus bar 450 may be fastened to an outer surface of the second plate 200 using screws.

The first through fourth openings 215, 217 may be formed adjacent to the first and second protruding portions 211, 213. For instance, a first opening 215 may be formed on one side of the first protruding portion 211, and a third opening may be formed on the other side of the first protruding portion 211. For instance, a second opening 217 may be formed on one side of the second protruding portion 213, and a fourth opening may be formed on the other side of the second protruding portion 213. Accordingly, one surface of the first connecting electrode 131 inserted into the first opening 215 in the first electrode receiving portion 231 of the second plate 200 may be brought into contact with a bottom surface of the first input bus bar 410. One surface of the second connecting electrode 132 inserted into the second opening 217 in the second electrode receiving portion 233 of the second plate 200 may be brought into surface contact with a bottom surface of the second input bus bar 420. One surface of the third connecting electrode 133 inserted into the third opening in the third electrode receiving portion of the second plate 200 is brought into surface contact with a bottom surface of the first output bus bar 450, and one surface of the fourth connecting electrode 134 inserted into the fourth opening in the fourth electrode receiving portion of the second plate 200 may be brought into surface contact with a bottom surface of the first output bus bar 450.

Accordingly, the first input bus bar 410 disposed in the first bus bar receiving portion 220 may be electrically connected to the first power semiconductor device 121 through the first connecting electrode 131 inserted in the first opening 215. The second input bus bar 420 disposed in the first bus bar receiving portion 220 may be electrically connected to the second power semiconductor device 123 through the second connecting electrode 132 inserted in the second opening 217. The first output bus bar 450 disposed in the second bus bar receiving portion 222 may be electrically connected to the first power semiconductor device 121 through the third connecting electrode 133 inserted in the third opening while being electrically connected to the second power semiconductor device 123 through the fourth connecting electrode 134 inserted in the fourth opening. In other words, the first output bus bar 450 may be commonly connected to the first and second power semiconductor devices 121, 123 via the third and fourth connecting electrodes 133, 134.

On the other hand, holes 651, 653 may be formed in each of the first through fourth connecting electrodes 131 to 134 and grooves 631, 633 having threaded portions may be formed in the first and second power semiconductor devices 121, 123. The first input bus bar 410 may be fastened to the first power semiconductor device 121 via the body 241 of the second plate 200 and the hole 651 of the first connecting electrode 131 using a screw 601. The second input bus bar 420 may be fastened to the second power semiconductor device 123 via the body 241 of the second plate 200 and the hole 653 of the second connecting electrode 132 using a screw 603. The first output bus bar 450 may be fastened to the first and second power semiconductor devices 121, 123 via the body 241 of the second plate 200 and a hole of each of the third and fourth connecting electrodes 133, 134 using screws.

The power semiconductor module 100 according to the embodiment may provide the third plate 300.

As described above, the third plate 300 may be symmetrical to the second plate 200 with respect to the first plate 110. The second plate 200 and the third plate 300 may have the same function, structure, and shape. Accordingly, the technical concept omitted in the following description may be easily understood from the description of the second plate 200 described above.

For instance, the third plate 300 may be disposed on the second surface of the first plate 110. For instance, the third plate 300 may include epoxy resin, but the present disclosure is not limited thereto.

For instance, the third plate 300 may include a body 341, a sidewall 343, and a partition wall 310. The body 341, the sidewall 343, and the partition wall 310 may be integrally formed.

At least one or more regions of the third plate 300, for instance, a bottom surface of the sidewall 343 and bottom surface of the partition wall 310 of the third plate 300 may be in contact with the second surface of the first plate 110.

The third plate 300 may include third and fourth device receiving portions 351, 353. A third power semiconductor and fifth and seventh connecting electrodes 135, 137 may be accommodated in the third device receiving portion 351. The third device receiving portion 351 may cover the third power semiconductor and the fifth and seventh connecting electrodes 135, 137. For instance, the third power semiconductor device 125 may be fastened onto a first region of the second surface of the first plate 110, and for instance, the fifth connecting electrode 135 may be connected to an input electrode pad of the third power semiconductor device 125, and the seventh connecting electrode 137 may be connected to an output electrode pad of the third power semiconductor device 125. Accordingly, the third power semiconductor and the fifth and seventh connecting electrodes 135, 137 may be protected by the third device receiving portion 351 of the first plate 110 and the third plate 300. Accordingly, the third power semiconductor device 125 may be protected by the third device receiving portion 351 of the first plate 110 and the third plate 300. Furthermore, even when the third power semiconductor device 125 is exploded by the third device receiving portion 351 of the first plate 110 and the third plate 300, other power semiconductor modules adjacent to the exploded power semiconductor device 100 may not be damaged.

A fourth power semiconductor and sixth and eighth connecting electrodes 136, 138 may be accommodated in the fourth device receiving portion 353. The fourth device receiving portion 353 may cover the fourth power semiconductor and the sixth and eighth connecting electrodes 136, 138. For instance, the fourth power semiconductor device 127 may be fastened onto a first region of the second surface of the first plate 110, and for instance, the sixth connecting electrode 136 may be connected to an input electrode pad of the fourth power semiconductor device 127, and the eighth connecting electrode 138 may be connected to an output electrode pad of the fourth power semiconductor device 127. Accordingly, the fourth power semiconductor and the sixth and eighth connecting electrodes 136, 138 may be protected by the fourth device receiving portion 353 of the first plate 110 and the third plate 300. Accordingly, the fourth power semiconductor device 127 may be protected by the fourth device receiving portion 353 of the first plate 110 and the third plate 300. Furthermore, even when the fourth power semiconductor device 127 is exploded by the fourth device receiving portion 353 of the first plate 110 and the third plate 300, other power semiconductor modules adjacent to the exploded power semiconductor device 100 may not be damaged.

The third plate 300 may include fifth and sixth electrode receiving portions 331, 333 for accommodating the fifth and sixth connecting electrodes 135, 136, respectively. Although not shown, the third plate 300 may include seventh and eighth electrode receiving portions for accommodating the seventh and eighth connecting electrodes 137, 138, respectively. The third plate 300 may include fifth and sixth openings 315, 317. Although not shown, the third plate 300 may include seventh and eighth openings.

The fifth electrode receiving portion 331 and the seventh electrode receiving portion may be connected to the third device receiving portion 351. The sixth electrode receiving portion 333 and the eighth electrode receiving portion may be connected to the fourth device receiving portion 353. The fifth opening 315 and the seventh opening may be connected to the fifth electrode receiving portion 331 and the seventh electrode receiving portion, respectively. The sixth opening 317 and the eighth opening may be connected to the sixth electrode receiving portion 333 and the eighth electrode receiving portion, respectively.

The fifth through eighth electrode receiving portions may be formed on an inner surface of the body 341 of the third plate 300.

Fifth engaging portion 631 may be formed on the fifth electrode receiving portion 331 meeting the fifth opening 315, and a sixth engaging portion 641 may be formed on the sixth electrode receiving portion 333 meeting the sixth opening 317. Although not shown, a seventh engaging portion may be formed on the seventh electrode receiving portion meeting the seventh opening, and an eighth engaging portion may be formed on the eighth electrode receiving portion meeting the eighth opening. The fifth connecting electrode 135 is formed with a fifth engaging protrusion 633 corresponding to the fifth engaging portion 631, and the sixth connecting electrode 136 is formed with a sixth engaging portion 643 corresponding to the sixth engaging portion 641. Although not shown, the seventh connecting electrode 137 is formed with a seventh engaging protrusion corresponding to a seventh engaging protrusion, and the eighth connecting electrode 138 is formed with an eighth engaging protrusion corresponding to an eighth engaging portion.

Therefore, when the fifth through eighth connecting electrodes 135 to 138 are provided to the fifth through eighth electrode receiving portions and the fifth through eighth openings 315, 317, the fifth engaging protrusion 633 of the fifth connecting electrode 135 may be fixed by the fifth engaging portion 631, and the sixth engaging protrusion 643 of the sixth connecting electrode 136 may be fixed by the sixth engaging portion 641. Furthermore, the seventh engaging protrusion of the seventh connecting electrode 137 may be fixed by the seventh engaging portion and the eighth engaging protrusion of the eighth connecting electrode 138 may be fixed by the eighth engaging portion.

The third plate 300 may include third and fourth device receiving portions 311, 313. Furthermore, the third plate 300 may include third and fourth bus bar receiving portions 320.

The third protruding portion 311 may be formed in a fifth region of the second surface of the third plate 300, and the fourth protruding portion 313 may be formed in a second region of the second surface of the third plate 300.

The third bus bar receiving portion 320 and the fourth bus bar receiving portion may be disposed with respect to the third and fourth protruding portions 311, 313. The third and fourth input bus bars 430, 440 may be accommodated in the third bus bar receiving portion 320, and the second output bus bar 460 may be accommodated in the fourth bus bar receiving portion 222.

A thickness of each of the third and fourth input bus bars 430, 440 and the second output bus bar 460 may be the same as a depth of the third and fourth bus bar receiving portions 320.

The fifth through eighth openings 315, 317 may be formed adjacent to the third and fourth protruding portions 311, 313. Accordingly, one surface of the fifth connecting electrode 135 inserted into the fifth opening 315 in the fifth electrode receiving portion 331 of the third plate 300 may be brought into contact with a bottom surface of the third first input bus bar 430. One surface of the sixth connecting electrode 136 inserted into the sixth opening 317 in the sixth electrode receiving portion 333 of the third plate 300 may be brought into surface contact with a bottom surface of the third input bus bar 430. One surface of the seventh connecting electrode 137 inserted into the seventh opening in the seventh electrode receiving portion of the third plate 300 is brought into surface contact with a bottom surface of the second output bus bar 460, and one surface of the eighth connecting electrode 138 inserted into the eighth opening in the eighth electrode receiving portion of the third plate 300 may be brought into surface contact with a bottom surface of the second output bus bar 450.

Accordingly, the third input bus bar 430 disposed in the third bus bar receiving portion 320 may be electrically connected to the third power semiconductor device 125 through the fifth connecting electrode 135 inserted in the fifth opening 315. The fourth input bus bar 440 disposed in the third bus bar receiving portion 320 may be electrically connected to the fourth power semiconductor device 127 through the sixth connecting electrode 136 inserted in the sixth opening 317. The second output bus bar 460 disposed in the fourth bus bar receiving portion 222 may be electrically connected to the third power semiconductor device 125 through the seventh connecting electrode 137 inserted in the seventh opening while being electrically connected to the fourth power semiconductor device 127 through the eighth connecting electrode 138 inserted in the eighth opening. In other words, the second output bus bar 460 may be commonly connected to the third and fourth power semiconductor devices 125, 127 via the seventh and eighth connecting electrodes 137, 138.

On the other hand, holes 655, 657 may be formed in each of the fifth through eighth connecting electrodes 135 to 138 and grooves 635, 637 having threaded portions may be formed in the third and fourth power semiconductor devices 125, 127. The third input bus bar 430 may be fastened to the third power semiconductor device 125 via the body 341 of the third plate 300 and the hole 655 of the fifth connecting electrode 135 using a screw 605. The fourth input bus bar 440 may be fastened to the fourth power semiconductor device 127 via the body 341 of the third plate 300 and the hole 657 of the sixth connecting electrode 136 using a screw 607. The second output bus bar 460 may be fastened to the third and fourth power semiconductor devices 125, 127 via the body 341 of the third plate 300 and a hole of each of the seventh and eighth connecting electrodes 137, 138 using screws.

First Through Fourth Bower Semiconductor Devices 121, 123, 125, 127

The power semiconductor module 100 according to an embodiment may provide the first through fourth power semiconductor devices 121, 123, 125, 127.

For instance, the first power semiconductor device 121 may be fastened to a first region of the first surface of the first plate 110. The second power semiconductor device 123 may be fastened to a second region of the first surface of the first plate 110. The first and second power semiconductor devices 121, 123 may have a full bridge connection structure together with the third and fourth power semiconductor devices 125, 127 which will be described later. Therefore, the power semiconductor module 100 including the first through fourth power semiconductor devices 121, 123, 125, 127 having a full bridge connection structure may be used as a converter for converting input power to generate output power.

Since the first and second power semiconductor devices 121, 123 and the first plate 110 are in surface contact with each other, heat generated from the first and second power semiconductor devices 121, 123 may be easily released to the first plate 110 and/or through a passage of the first plate 110.

Since the first and second power semiconductor devices 121, 123 are operated by a voltage of several kV to several ten kV, there exists a possibility of explosion. Accordingly, the first and second power semiconductor devices 121, 123 need to be completely shielded from the outside. To this end, the second plate 200 may be provided in the embodiment. The first and second device receiving portions 251, 253 may be formed on an inner surface of the second plate 200. The first and second power semiconductor devices 121, 123 may be accommodated in the first and second device receiving portions 251, 253 of the second plate 200. The first and second power semiconductor devices 121, 123 may be located in the first and second cell spaces formed by the first plate 110 and the second plate 200 and thus completely shielded from the outside. The first cell space may correspond to the first device receiving portion 251 and the second cell space may correspond to the second device receiving portion 253. Accordingly, even when the first or second power semiconductor explodes, other power semiconductor modules adjacent to the exploded power semiconductor module 100 may not be damaged.

The shapes of the first and second device receiving portions 251, 253 may correspond to those of the first and second power semiconductor devices 121, 123, respectively. For instance, when the first and second power semiconductor devices 121, 123 have a rectangular shape, the first and second device receiving portions 251, 253 may also have a rectangular shape. The volumes of the first and second device receiving portions 251, 253 may be greater than those of the first and second power semiconductor devices 121, 123, respectively. After the first and second power semiconductor devices 121, 123 is fastened onto the first surface of the first plate 110, the second plate 200 may be fastened onto the first surface of the first plate 110 to cover the first and second power semiconductor devices 121, 123. In this case, the first and second power semiconductor devices 121, 123 may be inserted into the first and second device receiving portions 251, 253 of the second plate 200. Therefore, since the thickness of the second plate 200 can be designed to be slightly larger than the thickness of the first and second power semiconductor devices 121, 123, the overall thickness of the power semiconductor module 100 according to the embodiment may be reduced.

For instance, the third power semiconductor device 125 may be fastened to a first region of the second surface of the second plate 200. The fourth power semiconductor device 127 may be fastened to a second region of the second surface of the second plate 200. The third and fourth power semiconductor devices 125, 127 may have a full bridge connection structure together with the first and second power semiconductor devices 121, 123 which will be described later. In the full bridge connection structure, for instance, the first and fourth power semiconductor devices 121, 127 may be turned on to output a positive high voltage, and the second and third power semiconductor devices 123, 125 may be turned on to output a negative high voltage. A switching operation in the bridge connection structure is well known, and thus further explanation is omitted. Therefore, the power semiconductor module 100 including the first through fourth power semiconductor devices 121, 123, 125, 127 having a full bridge connection structure may be used as a converter for converting input power to generate output power.

Since the third and fourth power semiconductor devices 125, 127 and the first plate 110 are in surface contact with each other, heat generated from the third and fourth power semiconductor devices 125, 127 may be easily released to the first plate 110 and/or through a passage of the first plate 110.

First Through Fourth Input Bus Bars 410 to 440 and First and Second Output Bus Bars 450, 460

The power semiconductor module 100 according to an embodiment may provide the first through fourth input bus bars 410 to 440 and the first and second output bus bars 450, 460.

The first input bus bar 410 and the second input bus bar 420 are accommodated in the first bus bar receiving portion 220 of the second plate 200, and the first output bus bar 450 may be accommodated in the second bus bar receiving portion 222.

Each of the first and second input bus bars 410, 420 may include first electrode regions 412, 422 and second electrode regions 414, 424. The first electrode regions 412, 422 are accommodated in the first bus bar receiving portion 220 of the second plate 200, and the second electrode regions 414, 424 are extended from the first electrode regions 412, 422 and disposed on an outer surface of the sidewall 243 of the second plate 200. The first electrode regions 412, 422 and the second electrode regions 414, 424 may be integrally formed.

The first input bus bar 410 may be brought into surface contact with the first connecting electrode 131 disposed in the first electrode receiving portion 231 of the second plate 200. The second input bus bar 420 may be brought into surface contact with the second connecting electrode 132 disposed in the second electrode receiving portion 233 of the second plate 200. The first output bus bar 450 may be brought into surface contact with the third connecting electrode 133 disposed in the third electrode receiving portion of the second plate 200, and also brought into surface contact with the fourth connecting electrode 134 disposed in the fourth electrode receiving portion of the second plate 200.

The first and second input bus bars 410, 420 and the first output bus bar 450 may be formed of a metal material having an excellent electrical conductivity. For instance, the first and second input bus bars 410, 420 and the first output bus bar 450 may be made of copper (Cu), but the present invention is not limited thereto.

The third input bus bar 430 and the fourth input bus bar 440 are accommodated in the third bus bar receiving portion 320 of the third plate 300, and the second output bus bar 460 may be accommodated in the fourth bus bar receiving portion.

Each of the third and fourth input bus bars 430, 440 may include first electrode regions 432, 442 and second electrode regions 434, 444. The first electrode regions 432, 442 are accommodated in the third bus bar receiving portion 320 of the third plate 300, and the second electrode regions 434, 444 are extended from the first electrode regions 432, 442 and disposed on an outer surface of the sidewall 343 of the third plate 300. The first electrode regions 432, 442 and the second electrode regions 434, 444 may be integrally formed.

The third input bus bar 430 may be brought into surface contact with the fifth connecting electrode 135 disposed in the fifth electrode receiving portion 331 of the third plate 300. The fourth input bus bar 440 may be brought into surface contact with the sixth connecting electrode 136 disposed in the sixth electrode receiving portion 333 of the third plate 300. The second output bus bar 460 may be brought into surface contact with the seventh connecting electrode 137 disposed in the seventh electrode receiving portion of the third plate 300, and also brought into surface contact with the eighth connecting electrode 138 disposed in the eighth electrode receiving portion of the third plate 300.

The third and fourth input bus bars 430, 440 and the second output bus bar 460 may be formed of a metal material having an excellent electrical conductivity.

First Through Eighth Connecting Electrodes 131 to 138

The power semiconductor module 100 according to an embodiment may provide the first through eighth connecting electrodes 131 to 138.

For instance, the first through fourth connecting electrodes 131 to 134 may be disposed on the first surface of the first plate 110. Specifically, the first and third connecting electrodes 131, 133 are disposed on the first power semiconductor device 121, and the second and fourth connecting electrodes 132, 134 are disposed on the second power semiconductor device 123. The first connecting electrode 131 may electrically connect the first input bus bar 410 to the first power semiconductor device 121. The second connecting electrode 132 may electrically connect the second input bus bar 420 to the second power semiconductor device 123. The third connecting electrode 133 may electrically connect the first output bus bar 450 to the first power semiconductor device 121. The fourth connecting electrode 134 may electrically connect the first output bus bar 450 to the second power semiconductor device 123. The first output bus bar 450 may be commonly connected to the first and second power semiconductor devices 121, 123.

The first through fourth connecting electrodes 131 to 134 may be media for connecting the first and second power semiconductor devices 121, 123 to the first and second input bus bars 410, 420 and/or the first output bus bar 450.

An upper surface and a lower surface of each of the first through fourth connecting electrodes 131 to 134 may have a flat surface.

The first through fourth connecting electrodes 131 to 134 may be electrically connected to the first and second power semiconductor devices 121, 123 through surface contact. For this purpose, an input electrode pad and an output electrode pad may be disposed on an upper surface of the first power semiconductor device 121, and an input electrode pad and an output electrode pad may be disposed on an upper surface of the second power semiconductor device 123. The input electrode pad and the output electrode pad of the first power semiconductor device 121 and the input electrode pad and the output electrode pad of the second power semiconductor device 123 may have a flat surface. Accordingly, a bottom surface of the first connecting electrode 131 may be brought into surface contact with an upper surface of the input electrode pad of the first power semiconductor device 121, and a bottom surface of the second connecting electrode 132 may be brought into surface contact with an upper surface of the input electrode pad of the second power semiconductor device 123. Accordingly, a bottom surface of the third connecting electrode 133 may be brought into surface contact with an upper surface of the output electrode pad of the first power semiconductor device 121, and a bottom surface of the fourth connecting electrode 134 may be brought into surface contact with an upper surface of the output electrode pad of the second power semiconductor device 123.

For instance, the fifth through eighth connecting electrodes 135 to 138 may be disposed on the second surface of the first plate 110. Specifically, the fifth and seventh connecting electrodes 135, 137 may be disposed on the third power semiconductor device 125, and the sixth and eighth connecting electrodes 136, 138 may be disposed on the fourth power semiconductor device 127. The fifth connecting electrode 135 may electrically connect the third input bus bar 430 to the third power semiconductor device 125. The sixth connecting electrode 136 may electrically connect the fourth input bus bar 440 to the fourth power semiconductor device 127. The seventh connecting electrode 137 may electrically connect the second output bus bar 460 to the third power semiconductor device 125. The eighth connecting electrode 138 may electrically connect the second output bus bar 460 to the fourth power semiconductor device 127. The second output bus bar 460 may be commonly connected to the third and fourth power semiconductor devices 125, 127.

An upper surface and a lower surface of each of the fifth through eighth connecting electrodes 135 to 138 may have a flat surface.

The fifth through eighth connecting electrodes 135 to 138 may be electrically connected to the third and fourth power semiconductor devices 125, 127 through surface contact.

In the embodiment, the first and second power semiconductor devices 121, 123 and the first and second input bus bars 410, 420 and the first output bus bars 450 are electrically connected through surface contact by the first through fourth connecting electrodes 131 to 134, thereby minimizing contact resistance to minimize power loss provided for power switching.

Filters 111, 112, 113

At least one or more filters 111, 112, 113 may be arranged on at least one or more regions of the first plate 110.

The at least one or more filters 111, 112, 113 may be screw-fastened to the at least one or more regions of the first plate (110). A plurality of passages may be formed inside the first plate 110. The at least one or more filters 111, 112, 113 may be arranged in a plurality of passages formed inside the first plate 110. When at least one of the first through fourth semiconductor devices 121, 123, 125, 127 explodes, the at least one or more filters 111, 112, 113 may perform the role of discharging gas generated due to the explosion to the outside.

The at least one or more filters 111, 112, 113 may be made of a metal oxide material having a porous structure. For a metal contained in the metal oxide, magnesium (Mg), cerium (Ce), and manganese (Mn) may be used.

The metal oxide material having a porous structure may be a material containing many pores. For instance, 30 to 95% of the total volume may be pores. The at least one or more filters 111, 112, 113 made of a metal oxide material having such a porous structure may have excellent properties in light weight, high specific strength, reaction acceleration due to increase of surface area, sound absorption and vibration resistance due to energy absorption ability, heat insulation due to internal pores, and heat transfer due to through pores.

Therefore, when one of the first through fourth power semiconductor devices 121, 123, 125, 127 is explode by at least one or more filters 111, 112, 113 made of a metal oxide material having a porous structure, the filtering of fine materials is possible. Furthermore, a pressure of high-pressure plasma gas generated by the explosion of one of the first through fourth power semiconductor devices 121, 123, 125, 127 may be instantaneously reduced and released to the outside by the at least one or more filters 111, 112, 113, thereby reducing a considerable amount of pressure and explosion sound.

Although not shown in detail in the drawings, the filters 111, 112, 113 may have a T-shaped structure. In other words, a plurality of first through-holes through which the first and second surfaces of the first plate 110 pass may be formed, and a plurality of second through holes connected to a side surface of the first plate 110 along a lateral direction from the first through holes may be formed. Therefore, the T-shaped structure may be formed by the first through holes and the second through holes, and the filters 111, 112, 113 may be also disposed in the first through holes and the second through holes to have a T-shaped structure. Accordingly, when the first semiconductor device 121 or the second semiconductor device 123 disposed on the first surface of the first plate 110 or the third semiconductor device 125 or the fourth semiconductor device 127 disposed on the second surface of the first plate 110 explodes to generate gas, pressure or explosion sound, the gas, pressure or explosion sound may be mitigated, removed or discharged to the outside through the filters 111, 112, 113 disposed in the first through holes and the second through holes The detailed description thereof should not be construed as restrictive in all aspects but considered as illustrative. The scope of the embodiment should be determined by reasonable interpretation of the appended claims and all changes that come within the equivalent scope of the embodiment are included in the scope of the embodiment.

What is claimed is:

1. A power semiconductor module, comprising:
    a first plate;
    a second plate configured to comprise first and second device receiving portions thereinside, and coupled to one side of the first plate;
    first and second power semiconductor devices arranged in the first and second device receiving portions;
    first and second input bus bars coupled to an outside of the second plate;
    a third plate configured to comprise third and fourth device receiving portions thereinside, and coupled to the other side of the first plate;
    third and fourth power semiconductor devices arranged in the third and fourth device receiving portions; and
    third and fourth input bus bars coupled to an outside of the third plate, and
    wherein the first plate and the second plate are sealed to shield the first and second device receiving portions from the outside,
    wherein the first plate and the third plate are sealed to shield the third and fourth device receiving portions from the outside, wherein the second plate includes a first partition wall placed between the first and the second device receiving portion, and a bottom surface of the first partition wall of the second plate is in contact with the one side of the first plate, and wherein the third plate includes a second partition wall place between the third and fourth device receiving portions, and a bottom surface of the second partition wall of the third plate is in contact with the other side of the first plate.

2. The power semiconductor module of claim 1, wherein at least one or more regions of the second plate is in contact with one side of the first plate, and at least one or more regions of the third plate is in contact with the other side of the first plate.

3. The power semiconductor module of claim 1, wherein the first and second input bus bars are connected to the first and second power semiconductor devices, respectively, outside the second plate, and the third and fourth input bus bars are connected to the third and fourth power semiconductor devices, respectively, outside the third plate.

4. The power semiconductor module of claim 1, comprising:

a first output bus bar disposed on an outside of the second plate, and connected to the first and second power semiconductor devices; and a second output bus bar disposed on an outside of the third plate, and connected to the third and fourth power semiconductor devices.

5. The power semiconductor module of claim 4, comprising:

first and second connecting electrodes configured to connect the first and second input bus bars to the first and second power semiconductor devices, respectively;

third and fourth connecting electrodes configured to connect the first output bus bar to the first and second power semiconductor devices, respectively;

fifth and sixth connecting electrodes configured to connect the third and fourth input bus bars to the third and fourth power semiconductor devices, respectively; and seventh and eighth connecting electrodes configured to connect the second output bus bar to the third and fourth power semiconductor devices, respectively.

6. The power semiconductor module of claim 5, wherein each of the first and third connecting electrodes is brought into surface contact with the first power semiconductor device, each of the second and fourth connecting electrodes is brought into surface contact with the second power semiconductor device, each of the fifth and seventh connecting electrodes is brought into surface contact with the third power semiconductor device, and each of the sixth and eighth connecting electrodes is brought into surface contact with the fourth power semiconductor device.

7. The power semiconductor module of claim 5, wherein the first and third connecting electrodes are disposed on the first power semiconductor device in the first device receiving portion, the second and fourth connecting electrodes are disposed on the second power semiconductor device in the second device receiving portion, the fifth and seventh connecting electrodes are disposed on the third power semiconductor device in the third device receiving portion, and the sixth and eighth connecting electrodes are disposed on the fourth power semiconductor device in the fourth device receiving portion.

8. The power semiconductor module of claim 5, comprising:

first and third electrode receiving portions disposed with the first and third connecting electrodes, respectively, and connected to the first device receiving portion;

second and fourth electrode receiving portions disposed with the second and fourth connecting electrodes, respectively, and connected to the second device receiving portion;

fifth and seventh electrode receiving portions disposed with the fifth and seventh connecting electrodes, respectively, and connected to the third device receiving portion; and sixth and eighth electrode receiving portions disposed with the sixth and eighth connecting electrodes, respectively, and connected to the fourth device receiving portion.

9. The power semiconductor module of claim 8, comprising:

first through fourth openings formed through the second plate, and connected to the first through fourth electrode receiving portions, respectively; and fifth through eighth openings formed through the third plate, and connected to the fifth through eighth electrode receiving portions, respectively.

10. The power semiconductor module of claim 9, wherein each of the first through eighth connecting electrodes comprises a body electrode disposed in the first through eighth electrode receiving portions and a protruding electrode inserted into the first through fourth openings.

11. The power semiconductor module of claim 10, wherein a size of the protruding electrode is smaller than that of the body electrode.

12. The power semiconductor module of claim 10, further comprising:

first through eighth engaging portions formed on the first through eighth electrode receiving portions meeting the first through eighth openings, respectively; and first through eighth engaging protrusions formed on the first through eighth connecting electrodes, respectively, to correspond to the first through eighth engaging portions, respectively.

13. The power semiconductor module of claim 10, comprising:

first and second protruding portions disposed along one direction in a central region outside the second plate; and third and fourth protruding portions disposed along one direction in a central region outside the third plate.

14. The power semiconductor module of claim 13, comprising:

first and second bus bar receiving portions disposed on first and second sides of the first and second protruding portions; and third and fourth bus bar receiving portions disposed on first and second sides of the third and fourth protruding portions.

15. The power semiconductor module of claim 14, wherein the first and second input bus bars are accommodated in the first bus bar receiving portion, the first output bus bar is accommodated in the second bus bar receiving portion, the third and fourth input bus bars are accommodated in the third bus bar receiving portion, and the second output bus bar is accommodated in the fourth bus bar accommodating portion.

16. The power semiconductor module of claim 15, wherein a thickness of each of the first and second input bus bars and the first output bus bar is equal to a depth of the first and second bus bar receiving portions.

17. The power semiconductor module of claim 15, wherein each of the first and second connecting electrodes is brought into surface contact with the first and second input bus bars,
   each of the third and fourth connecting electrodes is brought into surface contact with the first output bus bar,
   each of the fifth and sixth connecting electrodes is brought into surface contact with the third and fourth input bus bars, and
   each of the seventh and eighth connecting electrodes is brought into surface contact with the second output bus bar.

18. The power semiconductor module of claim 15, wherein the first input bus bar is fastened to the first power semiconductor device through the second plate and the first connecting electrode,
   the second input bus bar is fastened to the second power semiconductor device through the second plate and the second connecting electrode, and
   the first output bus bar is fastened to the first and second power semiconductor devices through the second plate and the third and fourth connecting electrodes, respectively.

19. The power semiconductor module of claim 18, wherein the third input bus bar is fastened to the third power semiconductor device through the third plate and the fifth connecting electrode,
   the fourth input bus bar is fastened to the fourth power semiconductor device through the third plate and the sixth connecting electrode, and
   the second output bus bar is fastened to the third and fourth power semiconductor devices through the third plate and the seventh and eighth connecting electrodes, respectively.

20. The power semiconductor module of claim 1, wherein the first plate is a cooling plate.

* * * * *